US009879997B1

(12) United States Patent
Kubena et al.

(10) Patent No.: US 9,879,997 B1
(45) Date of Patent: Jan. 30, 2018

(54) QUARTZ RESONATOR WITH PLASMA ETCHED TETHERS FOR STRESS ISOLATION FROM THE MOUNTING CONTACTS

(71) Applicant: HRL LABORATORIES, LLC, Malibu, CA (US)

(72) Inventors: Randall L. Kubena, Oak Park, CA (US); Yook-Kong Yong, Piscataway, NJ (US); Deborah J. Kirby, Calabasas, CA (US); David T. Chang, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/547,057

(22) Filed: Nov. 18, 2014

Related U.S. Application Data

(60) Provisional application No. 61/906,356, filed on Nov. 19, 2013.

(51) Int. Cl.
*G01C 19/5677* (2012.01)
*H03H 9/19* (2006.01)

(52) U.S. Cl.
CPC .......... *G01C 19/5677* (2013.01); *H03H 9/19* (2013.01)

(58) Field of Classification Search
CPC . G01C 19/56; G01C 19/5677; G01C 19/5684
USPC ... 73/504.12, 504.13, 504.15, 503.3, 514.29; 331/57; 310/367
See application file for complete search history.

(56) References Cited

U.S. PATENT DOCUMENTS

| | | | | |
|---|---|---|---|---|
| 3,702,073 A | * | 11/1972 | Jacobs | G01P 15/132 73/514.23 |
| 5,085,079 A | * | 2/1992 | Holdren | G01P 15/132 73/514.13 |
| 5,596,243 A | * | 1/1997 | Tsuru | H03H 9/0595 310/346 |
| 5,644,083 A | * | 7/1997 | Newell | G01P 1/003 73/514.13 |
| 5,959,207 A | * | 9/1999 | Letrondo | G01P 1/003 73/514.13 |
| 7,237,315 B2 | | 7/2007 | Kubena et al. | |
| 7,446,461 B2 | * | 11/2008 | Watanabe | G01C 19/5607 310/370 |
| 7,459,099 B2 | | 12/2008 | Kubena et al. | |

(Continued)

OTHER PUBLICATIONS

U.S. Appl. No. 14/249,723, filed Apr. 2014, Kubena, et al.

(Continued)

*Primary Examiner* — Laura Martin
*Assistant Examiner* — Jean Morello
(74) *Attorney, Agent, or Firm* — Ladas & Parry

(57) ABSTRACT

A resonator assembly includes a semiconductor substrate; a resonator gyroscope, the resonator gyroscope including a first resonator formed in a layer of a first material; and an oscillator on the semiconductor substrate, the oscillator including a second resonator formed of a second material. The second resonator is disposed in a cavity, the cavity comprising a first recess in the layer of a first material with the edges of the first recess being attached to the substrate, or the cavity comprising a second recess in the substrate and the edges of the second recess being attached to the layer of a first material.

28 Claims, 7 Drawing Sheets

(56) References Cited

U.S. PATENT DOCUMENTS

| | | |
|---|---|---|
| 7,581,443 B2 | 9/2009 | Kubena et al. |
| 7,647,688 B1 | 1/2010 | Chang et al. |
| 7,802,356 B1 | 9/2010 | Chang et al. |
| 7,830,074 B2 | 11/2010 | Kubena et al. |
| 7,851,971 B2 | 12/2010 | Chang et al. |
| 7,994,877 B1 | 8/2011 | Kubena et al. |
| 8,151,640 B1* | 4/2012 | Kubena .............. G01C 19/5684 73/503.3 |
| 8,176,607 B1 | 5/2012 | Kubena et al. |
| 8,402,824 B1 | 3/2013 | Kubena |
| 8,765,615 B1 | 7/2014 | Chang et al. |
| 8,912,711 B1* | 12/2014 | Chang ................ H03H 9/02102 310/320 |
| 9,038,459 B1 | 5/2015 | Kubena |
| 9,250,074 B1* | 2/2016 | Kubena .................. G01C 19/56 |
| 9,425,769 B1 | 8/2016 | White et al. |
| 2005/0062368 A1* | 3/2005 | Hirasawa ................ H03H 9/21 310/370 |
| 2006/0255691 A1* | 11/2006 | Kuroda .................... H03H 3/04 310/348 |
| 2007/0017287 A1 | 1/2007 | Kubena et al. |
| 2012/0025333 A1* | 2/2012 | Yoshida .............. G01P 15/0802 257/415 |

OTHER PUBLICATIONS

U.S. Appl. No. 12/820,761, filed Jun. 2010, Chang, et al.
U.S. Appl. No. 12/179,579, filed Jul. 2008, Kubena.
U.S. Appl. No. 14/628,182, filed Feb. 2015, Nguyen, et al.
U.S. Appl. No. 14/680,902, filed Apr. 2015, Kubena, et al.

* cited by examiner

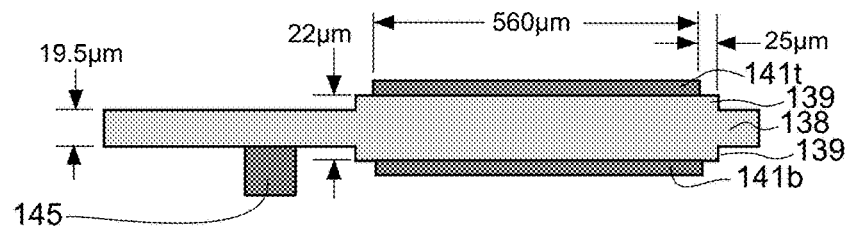
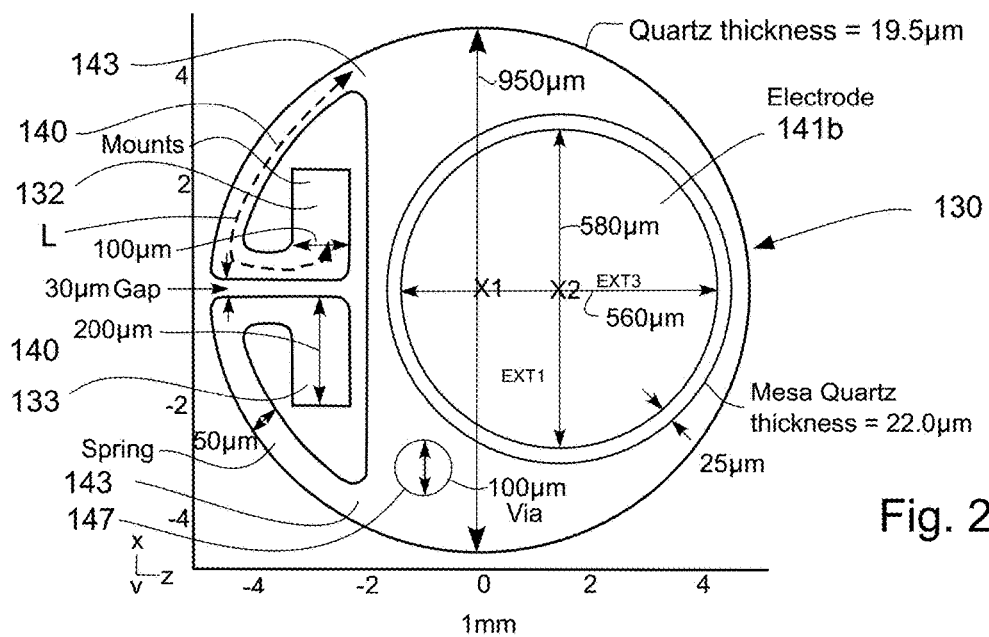
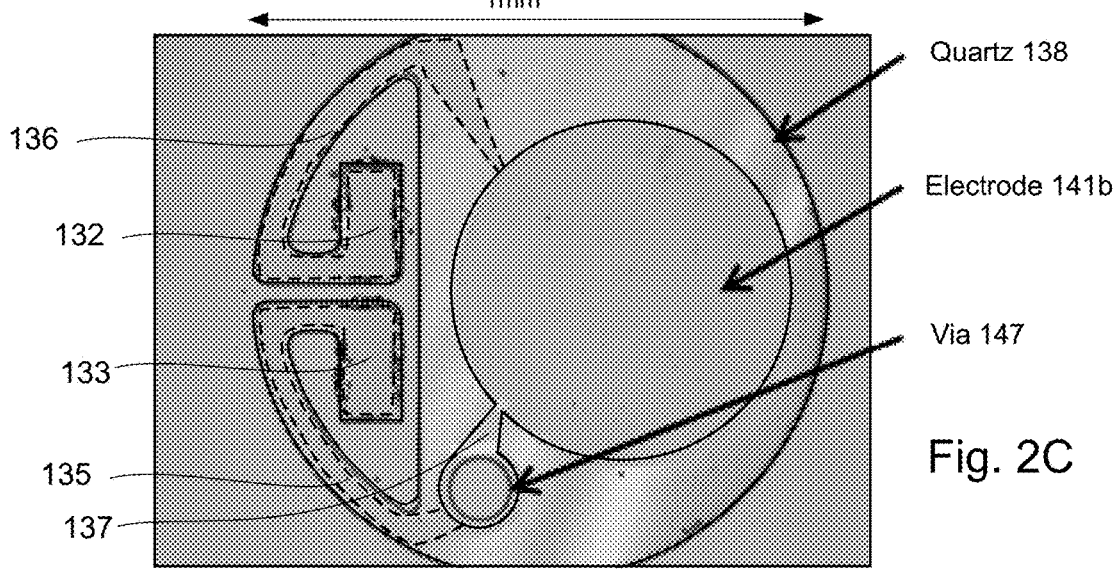
75 MHz C-cut quartz resonator bonded to Si on ~1 cm pitch

QUARTZ RESONATOR WITH PLASMA ETCHED TETHERS FOR STRESS ISOLATION FROM THE MOUNTING CONTACTS

CROSS REFERENCE TO RELATED PATENT AND APPLICATIONS

This application claims the benefit of U.S. Provisional Patent Application Ser. No. 61/906,356, filed Nov. 19, 2013, the disclosure of which is hereby incorporated herein by reference.

This application is related to U.S. patent application Ser. No. 14/249,723 filed Apr. 10, 2014 (now U.S. Pat. No. 9,250,074), the disclosure of which is hereby incorporated by reference. This application is also related to U.S. Pat. No. 7,581,443, issued on Sep. 1, 2009, the disclosure of which is also hereby incorporated by reference; to U.S. Pat. No. 7,459,099, issued on Dec. 2, 2008, the disclosure of which is also hereby incorporated by reference; to U.S. Pat. No. 8,151,640, issued on Apr. 10, 2012, the disclosure of which is also hereby incorporated by reference; and to U.S. Pat. No. 8,402,824, issued on Mar. 26, 2013, the disclosure of which is also hereby incorporated by reference.

This application is also related to the disclosure of US Patent Publication No. 2007/0017287 entitled "Disc Resonator Gyroscope" published Jan. 25, 2007, the disclosure of which is also hereby incorporated herein by reference.

This application is also related to the disclosure of U.S. patent Ser. No. 12/820,761, filed Jun. 22, 2010, and entitled "Thermal Stress Resistant Resonator, and a Method for Fabricating Same" (now U.S. Pat. No. 8,912,711) the disclosure of which is also hereby incorporated herein by reference.

STATEMENT REGARDING FEDERALLY SPONSORED RESEARCH OR DEVELOPMENT

The present Invention was made with support from the United States Government under contract number FA8650-05-C-7245 awarded by the Defense Advanced Project Agency (DARPA). The United States Government has certain rights in the invention.

TECHNICAL FIELD

The present disclosure generally relates to gyroscopes and also to MEMS structures and methods for fabricating a gyroscope with MEMS structures. More particularly, the present disclosure relates to a quartz-based resonator for used with a silicon-based disk resonator gyroscope, and more particularly to techniques for mounting the quartz-based resonator on a semiconductor substrate associated with the silicon-based disk resonator gyroscope.

BACKGROUND

Mechanical gyroscopes are used to determine direction of a moving vehicle platform based upon the sensed inertial reaction of an internally moving proof mass. A typical electromechanical gyroscope comprises a suspended proof mass, gyroscope case, pickoffs, drive and sense electronics. The inertial proof mass is internally suspended from the gyroscope's case that is rigidly mounted to the moving vehicle platform and helps determine the inertial motion of the platform while otherwise isolating the proof mass from external disturbances. The pickoffs to sense the Coriolis forces on the proof mass, the force rebalance electrodes to maintain or adjust this motion and the readout electronics that must be in close proximity to the proof mass are internally mounted to the case which also provides the electrical feed-through connections to the platform electronics and power supply. The case also provides a standard mechanical interface to attach and align the gyroscope with the moving vehicle platform. In various forms gyroscopes are often employed as a critical sensor for vehicles such as aircraft and spacecraft. They are generally useful for navigation or whenever it is necessary to autonomously determine the orientation of a free object.

US Patent Publication 20070017287, "Disc Resonator Gyroscopes," describes embodiments of a disk resonator gyroscope (DRG) as does U.S. Pat. No. 7,581,443, where a resonator layer is bonded to a Si substrate and then etched with deep reactive ion etching.

It is known to make a MEMS quartz resonator for a quartz clock that can be bonded and integrated to a Si substrate, as described in U.S. Pat. No. 7,459,099.

U.S. Pat. No. 8,151,640 teaches using planar bonding techniques to first integrate a quartz clock resonator on a semiconductor substrate, followed by the integration of a High-Aspect-Ratio Si DRG Resonator on the substrate.

BRIEF DESCRIPTION OF THE INVENTION

In one aspect the present invention provides a resonator assembly comprising: a substrate; a resonator gyroscope, the resonator gyroscope including a first resonator formed in a layer of a first material; and an oscillator disposed on or in the substrate, the oscillator being associated with and electrically coupled to a second resonator, the second resonator having electrodes disposed on opposing surfaces of a substrate formed of a second material; and wherein the second resonator is supported from said substrate in a cantilevered fashion by springs or tethers formed of said second material, the springs or tethers having electrical conductors disposed thereon which ohmically couple the electrodes of the second resonator with the oscillator.

In another aspect the present invention provides a fabrication process for a resonator assembly, the process comprising: providing a substrate; forming an oscillator resonator having electrodes disposed on opposing surfaces of a layer of material, the oscillator resonator also having elongate springs or tethers, the elongate springs or tethers being formed from said layer of material, the elongate springs or tethers having conductors formed thereon, the conductors also being formed on the layer of material to make electrical contact with said electrodes disposed on opposing surfaces of the layer of material, said conductors also making electrical contact with contacts formed on distal ends of said elongate springs or tethers, and attaching the oscillator resonator to the substrate at the contacts formed on the distal ends of said elongate springs or tethers of the oscillator resonator.

In yet another aspect the present invention provides a method of making a quartz shear-mode resonator comprising the steps of: forming resonator electrodes on two opposing sides of a quartz substrate; forming at least one via through the quartz substrate; shaping the quartz substrate to assume a rounded shape and cutting or otherwise forming springs or tethers in the quartz substrate, an exterior surface of each of the springs or tethers continuing to follow said rounded shape along a major portion of a length of each spring or tether after being cut in the quartz substrate; forming connection pads at distal ends of the springs or tethers on a common side thereof; and connecting the connection pads on distal ends of the springs or tethers with said resonator electrodes on two opposing sides of a quartz substrate, one connection from one of the connection pads on one distal end of the one of the springs or tethers to one of the resonator electrodes using said via to go from one major surface of the shaped quartz substrate to the opposing major surface thereof.

In still yet another aspect the present invention provides a resonator having an active or electrode region and two support arms which conformally wrap in a smooth opposing curves from the resonator active or electrode regions to contacts disposed at a distal end and on a common side of said support arms to thereby minimize a lateral dimension of the resonator while stress isolating the the contacts from the active or electrode region of said resonator.

BRIEF DESCRIPTION OF THE DRAWINGS

FIGS. 2A and 2B depict the layout of a circular SC-cut 75-MHz resonator with tethers to isolate the stress from the mounts from the active region, FIG. 2A being a top plan view thereof and FIG. 2B being a side elevational view thereof, the side elevational view being exaggerated in height for ease of illustration and explanation.

FIG. 2C is another top plan view of the resonator showing the metalization on the tethers or springs of the resonator.

DETAILED DESCRIPTION

Figure 1A:
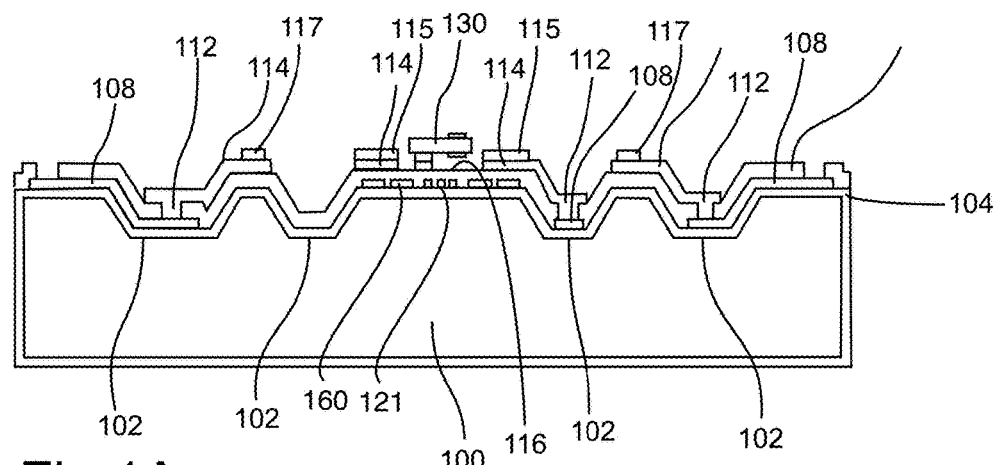
FIGS. 1A-1C show three steps of the fabrication of an on-chip resonator assembly comprising a quartz resonator under the central base of a Si DRG resonator in accordance with the present disclosure.

FIG. 1A shows a substrate 100 that may be composed of a semiconductor material, such as silicon, SiGe, or a group III-V material or of a dielectric material, such as quartz. Typically, this substrate can be previously fabricated with built-in circuitry such as signal processors and/or a Global Positioning System (GPS). One or more recesses 102 are etched in the substrate 100 to provide geometry for the components to be added to the substrate 100. Alternatively, the recesses 102 can be formed by depositing additional layers upon the substrate 100 surrounding the recessed areas 102. The geometry can provide connection between later-added top-side components (such as a DRG and a quartz oscillator) and any substrate 100 circuitry.

An oxide layer 104 may then be deposited or otherwise formed on the substrate 100, particularly if the substrate is formed of a semiconductive material. Top-side vias (not shown) may be etched or otherwise provided to allow access to the substrate 100 by depositing conductive material in the vias. This is especially important if there are further components in or under the substrate 100 (such as GPS and/or signal processing circuitry in the substrate) to which contact is desired.

One or more resistive heater elements 160 and a RTD (Resistance Temperature Detector) 121 are preferably formed on oxide layer 104 in a central region of the substrate 100.

Metal interconnects 108 are deposited or otherwise formed on the thermal oxide layer 104 and a dielectric 110 is preferably deposited (or otherwise formed) on the exposed surface. One or more vias 112 are etched into the dielectric 110 to allow access to the metal interconnects 108. Additional interconnects 114 are formed on dielectric 110. Contacts 115, 117 (for making ohmic contact with the DRG) are formed on interconnects 110. Interconnects 108 and 114 may be formed of, for example, aluminum, while contacts 115, 117 may be formed of gold.

Contacts 117 and the interconnect metal 115 under them define a centrally disposed metal region on dielectric 110 with an area 116 between contacts 117. In the embodiment presently disclosed, the DRG comprises a resonator with a central base, and contacts 117 provide for contacting a central base of the DRG resonator. Area 116 preferably exposes a portion of the dielectric 110 and the one or more resistive heater elements 160 and the RTD 121 are either totally or at least partially disposed under the portion of the dielectric 110 within the circumferential confines of area 116. The area 116 preferably has a circular or near circular configuration when viewed from the top down.

A quartz oscillator resonator 130 is described in greater detail below with reference to FIGS. 1D and 2B (and preferably fabricated as disclosed in relation with FIGS. 2A-2I of U.S. Pat. No. 8,151,640), is disposed in area 116 and preferably over the one or more resistive heater elements 160 and the RTD 121. The quartz oscillator resonator 130 preferably has a pair of metallic contacts 132, 133 (see FIG. 1D) which are preferably built up to form a pair of metallic mounting contacts 145 (see FIG. 2B) which are in turn compression bonded to two posts 120 preferably formed of interconnect metal (Al) and contact metal (Au) formed on substrate 100. Only one such post 120 can be seen in FIG. 1B, for example, since the second post is hidden behind the first port in this side elevation view.

Figure 1B:
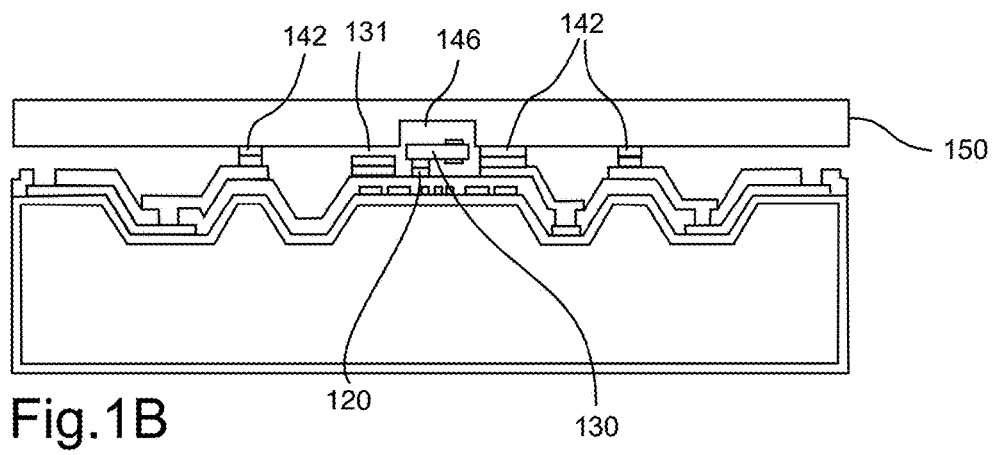

FIG. 1B shows a gyroscope resonator wafer 150 assembled to the bond metal layer 114 of FIG. 1A via a further bond metal layer 142 that was previously deposited on the resonator wafer 140 in a pattern for forming a disk resonator gyroscope (DRG). The material of wafer 150 can be the same as the material that the resonator 130 is composed of (for example, quartz), or can be a different material (for example, silicon). In the embodiment illustrated, the two materials are different. Wafer 150 is preferably formed of silicon and while resonator 130 is preferably formed of quartz. Alternatively, the wafer 150 could be made of quartz and/or the resonator 130 could be made of silicon.

In the embodiment presently disclosed, the wafer 150 is preferably etched so that it preferably provides a recess 146 above area 116. Recess 146 is preferably formed in the portion of the wafer 150 that is to become the central base of the resonator formed in wafer 150. The wafer 150 is then arranged such that those areas immediately adjacent the edges of recess 146 are attached to the substrate 100 by at contacts 115 and 142 surrounding around area 116. The resonator 130 is thus enclosed in a cavity formed by recess 146, area 116 and the portions of contacts 115, 142 (and the interconnect metal 114 associated with them) around area 116.

It is noted that instead of having a flat area 116 and a wafer 140 having a recess 146, area 116 could occur instead in a recess in substrate 100 and wafer 140 could be flat to form the cavity that encloses the resonator 130, or both area 116 and wafer 140 could include a recess to form the cavity that encloses the resonator 130.

A circuitry wafer (not shown) containing, for example, analog/digital low-powered CMOS circuitry for additional components, such as a GPS and/or a signal processor, can optionally be bonded to the opposite side of the substrate 100 or integrated into or with substrate 100.

Since the oscillator 130 could be damaged by excessive heat, the resonator wafer 150 is preferably bonded to the bond metal layer 114 using a low-temperature bonding technique, such as, for example, Au—In compression bonding or Au—Sn compression bonding. In the Au—In thermal compression bonding scheme, the components are heated to a temperature of about 100 degree Celsius to 300 degree Celsius in a vacuum having a pressure preferably no greater than $10^{-4}$ Torr. Then the bond metal pads 142, 115 and 117 of the components may be pressed together, while being depressurized, with a pressure of approximately 1 MPa.

Figure 1C:
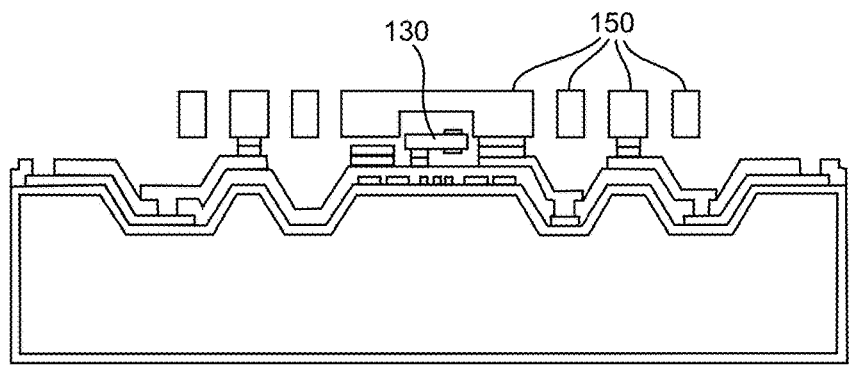

FIG. 1C depicts the resonator wafer 150 having been etched in a pattern to create a DRG resonator 150 (as, for example, illustrated in FIG. 4M of U.S. Pat. No. 8,151,640). Resonator 150 can comprise a system of interconnected rings supported at a central support with internal drive and sense electrodes formed from material left in circumferential slots of resonator; the drive and sense electrodes generally interacting with the disc resonator 150 in the plane of the resonator across narrow gaps between the electrodes and the resonator structure. If the DRG resonator is formed of quartz, instead of being etched in place, it is preferably etched separately using a handle wafer as described, for example, in US Patent Publication No. 2007/0017287.

In the embodiment presently disclosed, the oscillator resonator 130 is enclosed in a cavity partially defined by recess 146 and therefore the oscillator resonator 130 is not etched when forming the DRG resonator 150. Thus the oscillator resonator 130 is protected from the etching processes that etch the DRG resonator 150 material. Because the oscillator resonator 130 is protected from the DRG resonator etching processes, the oscillator 130 can be composed of or include a material that would otherwise be degraded by the DRG resonator etching processes.

Further, because the oscillator resonator 130 is protected from the DRG resonator etching processes, the electrodes and conductive interconnects for the oscillator 130 can comprise a metal that would otherwise be degraded by the etching process. For example, the DRG resonator 150 can be etched using a deep reactive ion etching (DRIE) process, such as a fluorine-based plasma DRIE process, and the electrodes and conductive interconnects for the oscillator 130 can comprise gold, which would be degraded by such a process.

It is noted that, alternatively to vacuum-sealing the cavity holding resonator 130, one or more vent holes 131 can be provided in the seal ring formed by the bond metal pads 142, 117, to allow a subsequent vacuum packaging of the resonator 130 and the resonator 150 simultaneously in a common vacuum housing. The vent holes 131 would then be preferably arranged so that the etching process that etches the DRG resonator 150 out of wafer 150 does not detrimentally affect the resonator 130.

It is also noted that, whereas in the embodiment presently disclosed, the DRG comprises a resonator 150 having a central base and the cavity enclosing the resonator 130 is formed in the thickness of the central base of the resonator 150, the cavity formed by recess 146 can alternatively be formed in a location other than the central base of resonator 150. The cavity can be formed in any portion of the wafer 150 of sufficient size and that will not be etched through when forming the DRG resonator 150. For example, a portion of wafer 150 that would otherwise have been etched away when forming resonator 150 can be maintained un-etched to cover a cavity enclosing the resonator 130. The maintained un-etched portion of wafer 150 covering the cavity would then be chosen so as to not impair the proper operation of resonator 150. But the central location under the central base of the DRG resonator 150 is the preferred location for the cavity defined by recess 146 in order to minimize the overall footprint of the combined gyro and resonator.

Figure 1D:
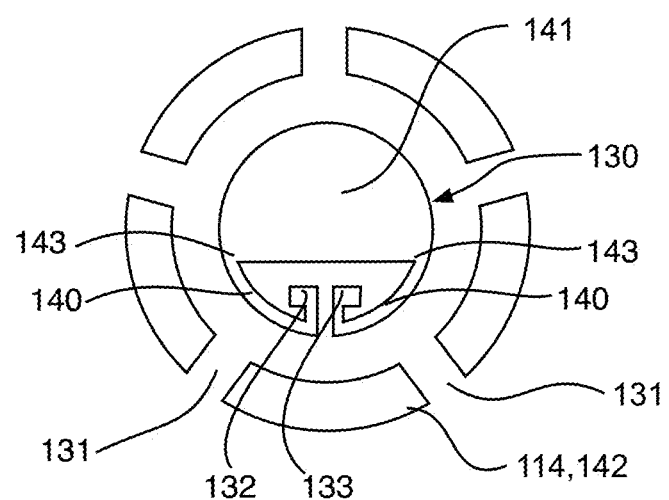
FIG. 1D is a top view of the quartz resonator enclosed in the cavity of FIGS. 1B-1C in accordance with the present disclosure.

FIG. 1D is a top view showing one embodiment of the quartz resonator 130 and the seal ring formed by the bond metal pads 142, 117, with vent holes 131 can be provided in the seal ring of DRG resonator 150.

Figure 1E:
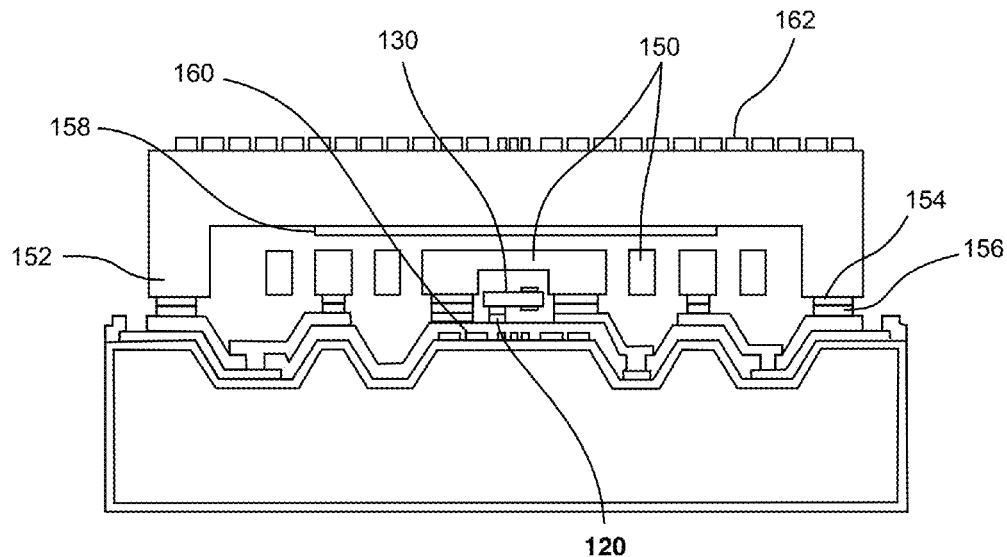
FIG. 1E depicts a final ovenized tightly-coupled integrated quartz clock and Si DRG as illustrated in FIGS. 1A-1D in a wafer-level vacuum package with a top heater on a top capping Si layer in accordance with the present disclosure.

FIG. 1E shows a sealed cover 152 attached over the components on substrate 100. The cover 152 can include a mating seal ring 154 to be aligned and bonded to a base seal ring 156 on substrate 100. A getter 158 can optionally be placed on an inside surface of the cover to absorb free gases if the area sealed by the cover is under vacuum. The getter 158 can be Ti-based, but the utilization of other getter materials are well known in the art. In addition to protecting the components from dust and humidity from the environment, the cover 152 also helps ensure that environmental changes (temperature, vibration, etc.) to one component within the sealed area is approximately the same as the environmental change in other components within the sealed area.

Heater 160, which is preferably disposed on the substrate under area 116, and can efficiently heat both resonator 130 and resonator 150 under cover 152, thus reducing the power needed and reducing thermal gradient and thermal transients between resonator 130 and resonator 150 for ovenized operation. A further heater 162 can be arranged on either an external surface of cover 152 (as shown) or internally, closer to the DRG, for ovenized operation. A further heater (not shown) can also alternatively or additionally be arranged on the bottom of the substrate. One or more compliant stand-off (not shown) can be provided, for example on the bottom of the substrate, for mounting the substrate; for example in a housing or package, or on a board comprising various elements (not shown) such as a Clapp sustaining circuit for the quartz oscillator, or closed loop electronics for the Si DRG.

If resonator 130 is a SC-cut quartz resonator, the entire housing can be heated to approximately 80° C. for optimized stability since the SC-cut resonator has a minimal frequency sensitivity to temperature changes in this temperature range. As noted above, the protective recess 146 can be bonded to the semiconductor substrate using vent holes within the seal ring in order to allow venting of the trapped gas during vacuum packaging. High-aspect-ratio (>10) Si DRGs have been shown to operate with highest Q for vacuum pressures <1 mT. High performance quartz clocks also require mT vacuums to prevent frequency drifts and instabilities due to residual gas adsorbing or desorbing from the surface. Thus, the vacuum requirements for both high Q DRGs and high quartz clock stability (the clock employing resonator 130 for stability) are similar and can be met with a single vacuum environment.

Typical thicknesses of mm-size Si DRG Resonators are from about 100 to 250 microns while typical thicknesses of the shear-mode quartz resonators are 1 to 100 microns. Moreover, the lateral mounting stem diameter for an 8 mm diameter Si DRGs is about 2 mm while the lateral quartz plate dimensions for many VHF quartz resonators is 1 mm or less. Thus, for many designs of the Si DRG and the quartz resonators, the quartz resonator can be enclosed in a protective Si cavity made from the same active Si layer used to form the Si DRG Resonator. This simplifies the processing steps and provides the ability to use thicker, lower frequency quartz resonators with Au electrodes for higher stability clocks. Without the protective cavity, the quartz electrodes should have a very high etch selectivity compared to Si during the deep reactive ion etching of the High-Aspect-Ratio Si Resonator, as disclosed in U.S. Pat. No. 8,151,640. This necessitates using electrodes such as Al which does not provide a high level of energy trapping for high Q HF or VHF quartz resonators.

Figure 1F:
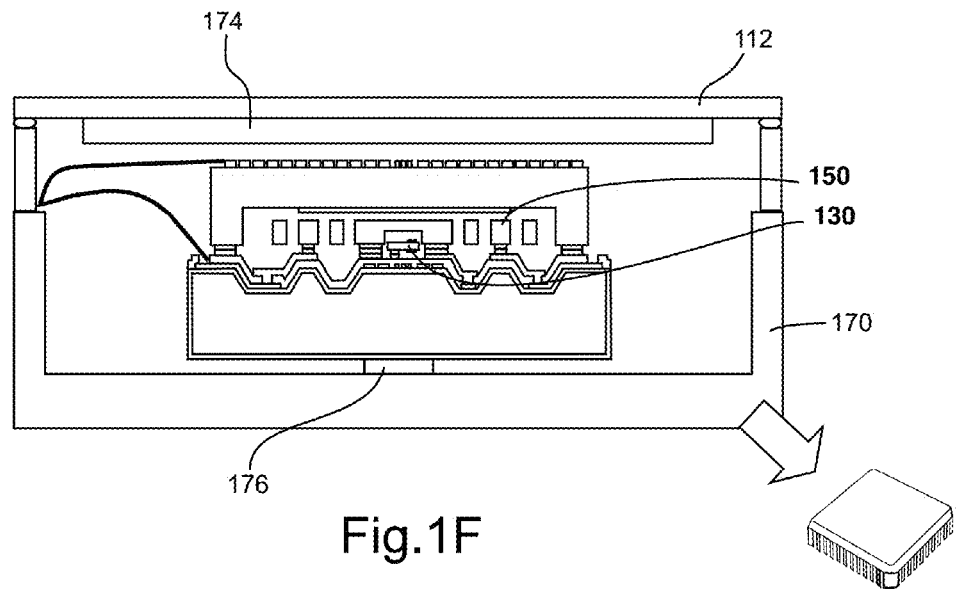
FIG. 1F depicts a final ovenized tightly-coupled integrated quartz clock and Si DRG in a LCC vacuum packaged in accordance with the present disclosure.

FIG. 1F shows the sealed assembly of FIG. 1E arranged in a vacuum sealed LLC-type package 170 having a lid 172. A getter 174 is preferably provided inside package 170, for example on the interior surface of lid 172. It is noted that, when the assembly of FIG. 1E is arranged in such package, cover 152 does not need to be vacuum sealed and getter 158 does not need to be provided in cover 152. Vents (not shown) comparable to vents 130 can then be provided in base seal ring 156. Top heaters (not shown) can be added to the lid to ensure isothermal heating of the package. The bottom of the substrate comprises a compliant stand-off 176 for mounting the substrate in package 170.

Preferably, the DRG and substrate 100 are both formed of silicon, while the resonator 130 is formed of quartz. Differential thermal expansion between the quartz of the resonator 130 and the Si of substrate 100 can produce stress in the quartz which leads to strain. Strain in the quartz, in turn, changes the elastic constants, density and dimensions of the quartz plate used in resonator 130. These changes can affect the frequency versus temperature characteristics of the quartz resonator. With the metallic bonding of the resonator 130 to the Si substrate 100, the use of flexible tethers 140 etched directly into or from the quartz is desirable for stress isolation. See, for example, U.S. patent application Ser. No. 12/820,761 (now U.S. Pat. No. 8,912,711) referenced above. Instead of the rectilinear tethers of U.S. patent application Ser. No. 12/820,761, the tethers 140 are preferably formed in a circular conformal manner to contour to or follow the outer perimeter of a generally circular or elliptical shaped resonator 130 which can produce a very compact resonator design with a preferable overall circular or even an elliptical footprint. See FIGS. 1D and 2A-2C which show an overall generally circular footprint. The general circular shape of the resonator 130 may just approximate a true circle or even an ellipse with a plurality of more or less straight lines as shown in FIG. 2A. This generally circular configuration of the resonator 130 allows the resonator to be conveniently integrated into the base of a circularly symmetric gyro 150 such as that depicted in FIG. 1F, for example. This integration provides for maximum coupling of the resonator 130 and gyro 150 to common thermal and mechanical environmental disturbances and reduces the overall size of the package.

The ovenization approach of U.S. Pat. No. 8,402,824 improves the performance of inertial MEMS devices using a frequency locking technique with two resonators, such as the DRG 150 and the resonator 130 disclosed herein, with different f/T (frequency/Temperature) characteristics. This technique has been shown to substantially improve the bias and turn-on to turn-on stability of gyroscopes. Using the resonator 130 disclosed herein, the quartz and Si gyro resonators can be integrated with a very small footprint that is no larger than the gyroscope itself. This design produces a small and rigid package for air and ground vehicle navigation systems. The accuracy of the ovenization technique is improved by minimizing thermal gradients and thermal time constants between the two resonators, and thus the DRG 150 and the resonator 130 should be proximate each other.

Stress isolation from thermally-induced forces from the mounts on the substrate 100 to which the tethers 140 are attached is important for preventing modifications of the f/T characteristics of the quartz resonator 130. The expected f/T profiles can be rotated and large activity dips can be introduced by stress which prevent accurate compensation over temperature extremes. Once the proper angle of cut is modeled for a desired f/T profile, the compensation and ovenization parameters can be calculated. However, if these f/T profiles are modified by mounting stresses, then compensation and ovenization become more difficult and less accurate. Several methods have been used in the past for stress isolation. One is to move the active region away from the mounts. See U.S. patent application Ser. No. 12/820,761 (now U.S. Pat. No. 8,912,711). However, that approach increases the overall size of the resonator. The approach disclosed herein uses wafer-level plasma etching to define springs or tethers 140 in the quartz plate of the resonator 130 which tethers 140 act as springs to help relieve the mounting stresses which can otherwise adversely affect the active region 141 of the resonator 130. These springs or tethers 140 are preferably etched in the quartz substrate 138 of the resonator 130 and preferably at the same time as the active region 141 of the resonator 130 is etched, thus requiring no extra processing steps to form them. Moreover, the springs or tethers 140 preferably wrap around following on their outside surfaces a generally circular shape for a majority of their lengths as measured from where they depart (see the lead lines numbered 143 on FIG. 1D) a main body portion of the resonator near the active region 131 thereof. However, these springs or tethers 140 can add unwanted extra size to the resonator if they do not warp around in a more or less circular fashion as disclosed herein. Hence, by wrapping the springs or tethers 140 around at least a portion of the exterior of the active region 141 of the resonator 130, the stress propagation can be reduced while the overall size of the resonator 130 is only minimally impacted. The springs or tethers 140 could also follow a more elliptical shape if desired.

The springs or tethers 140 at the distal ends have metallic contacts 132,133 which are preferably built up (thickened— see FIG. 2B) to form a pair of metallic mounting contacts 145 which face substrate 100 when mounted to posts 120 formed thereon. The resonator 130, when mounted on posts 120, is preferably suspended in a cantilevered fashion within the cavity formed by recess 146 and the active region 141 of the resonator 130 is preferably supported only by springs or tethers 140.

An embodiment of this new design resonator 130 with springs or tethers 140 is shown in FIGS. 1D and 1n even greater detail in FIGS. 2A-2C. Note that the springs or tethers 140 of this embodiment follow a generally circular path from the active region 141 to the contacts 132, 133 and help create, in this embodiment, a 1 mm diameter circular footprint for the entire structure. The springs or tethers 140 provide two support arms which conformally wrap in a smooth opposing curves from points 143 near the resonator active or electrode region 141 to the contacts 132, 133 disposed at a distal end of each spring or tether 140. The contacts 132, 133 are disposed on a common side of said support arms and metalization (depicted only on FIG. 2C for ease of illustration) is utilized to make circuit contact with contacts 132, 133 (and thus with 145) to the resonator active or electrode region 141 top and bottom surfaces 141$t$ and 141$b$. The top surface 141$t$ of the resonator active or electrode region 141 is coupled to contact 133 on the bottom surface of the resonator at the end of one of the springs or tethers 140 via a metallic thru via 147 and metalization 135, 137 shown on FIG. 2C. The bottom surface 141$b$ of the resonator active or electrode region 141 is coupled to contact 132 on the lower surface at the end of the other one of the springs or tethers 140 by metalization 136 shown on FIG. 2C.

In the embodiment depicted by FIGS. 2A-2C, the springs or tethers 140 preferably have a width of 50 μm (see FIG. 2A), a height of 19.5 μm (see FIG. 2B) and a length L (see FIG. 2A) from point 143 to their contacts 132, 133 preferably exceeding 500 μm. The springs or tethers 140 spaced form each other and from the quartz substrate 138 by a distance preferably of 30 μm or more. Those skilled in the art may well utilize different dimensions (instead of the dimensions set forth earlier in this paragraph, for example), but for the tethers 140 to function as springs it is preferable that the ratio of their length to a maximum dimension in either height or width be at least five or greater (the ratio is about ten in this embodiment) so that they are elongate. The springs or tethers 140 preferably follow a smooth curve from points 141 to their respective contacts 132,133 to help reduce stress concentrations which might otherwise occur if the springs or tethers 140 have a sharp corner as can be seen in the embodiment of FIG. 1D. The springs or tethers 140 of the embodiment of FIGS. 2A-2C smoothly connect at point 143 with a smooth interior radius or fillet and turn inwardly towards contacts 132, 132 with a smooth exterior radius or fillet. The embodiment of FIGS. 2A-2C helps minimize the lateral dimensions of the resonator while stress isolating the contacts 132, 133 from the active or electrode region 141 of the resonator 130 and at the same time helping to reduce undesirable stress concentrations at the active or electrode regions 141 by eliminating sharp corners in the springs or tethers 140 themselves and where they join (at points 141) with the main body of quartz adjacent the active region 141 of the resonator 130.

The electrode or active region 141 of the resonator 130 includes a pair of electrodes with top and bottom surfaces 141$t$ and 141$b$. These electrodes preferably each sit on a mesa of quartz material 139 which projects slightly above the remaining quartz and which is preferably utilized to help confine acoustic modes to the electrode or active region 141 of the resonator 130. The size and shape of the mesa can be optimized by trial and error. If a mesa is utilized, then the metalization 136, 137 must climb over the step of the mesa 139 to make contact with the respective electrodes. The corresponding step in metalization 136, 137 can be formed, for example, by planetary e-beam evaporation.

Figure 3:
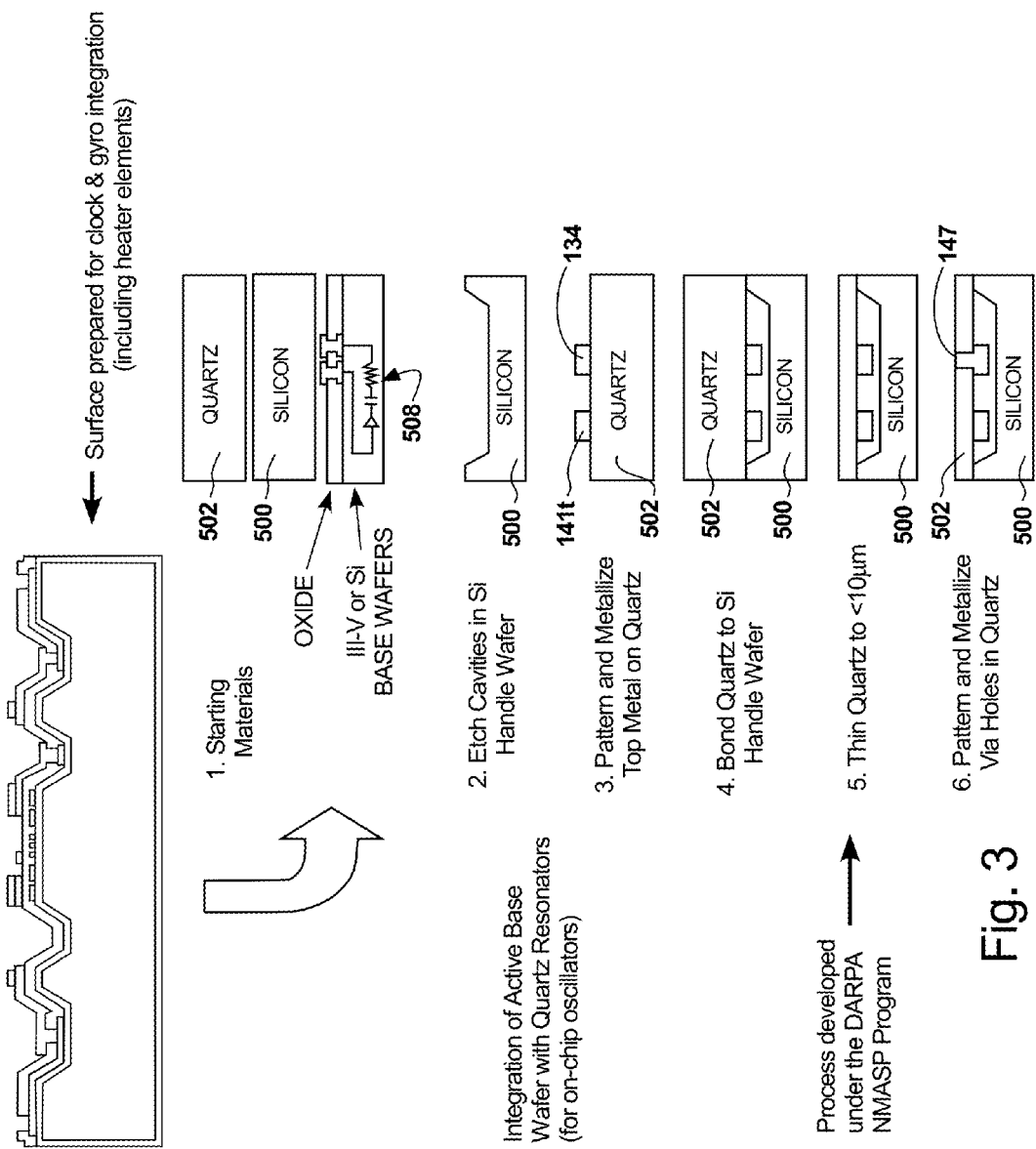
FIG. 3 depicts a schematic of the various steps preferably used to make the resonator.
Figure 3:
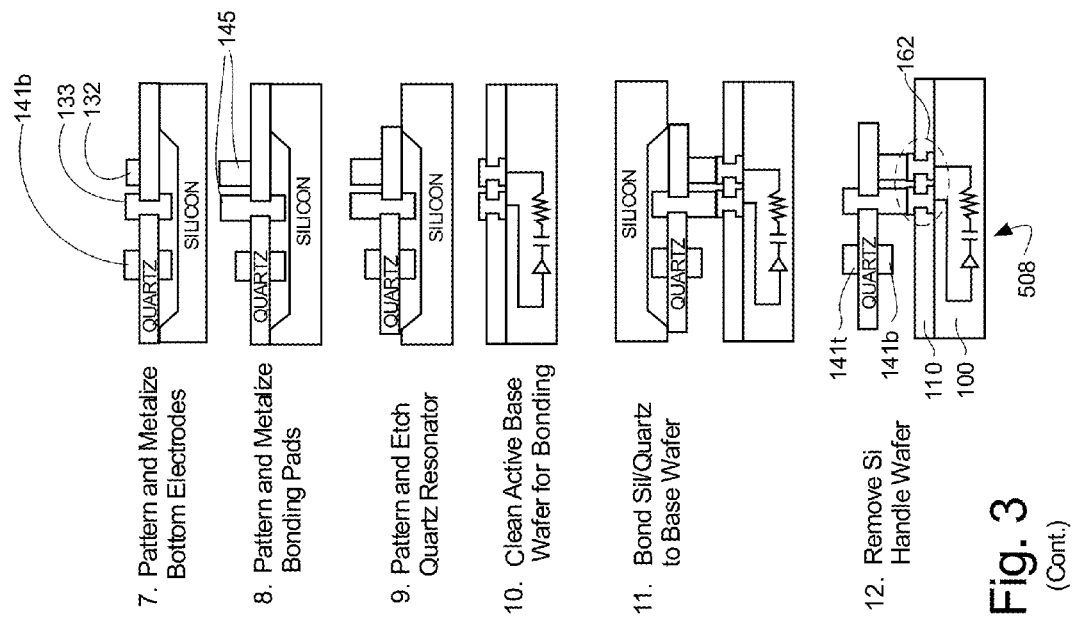

Analysis of the stress propagation into the active region 141 for this design is shown in FIG. 3 of U.S. Provisional Patent Application Ser. No. 61/906,356. Most of the stress is attenuated in the arms of the tethers 140, and the resulting stress at the center of the electrode 141 is 40.3 kPa at an operating condition of 80° C. This provides a very low stress level and mitigates ppm level changes in the frequency of the resonator. A high fidelity plasma etch capability is should be utilized to form springs or tethers 140 preferably having approximately 50 Tim width tethers with preferably a minimum 30 μm spacing at their points of closest approach to each other and to the main body of quartz material. These dimensions are comparable to the thickness of the quartz in VHF shear-mode resonators.

Figure 4:
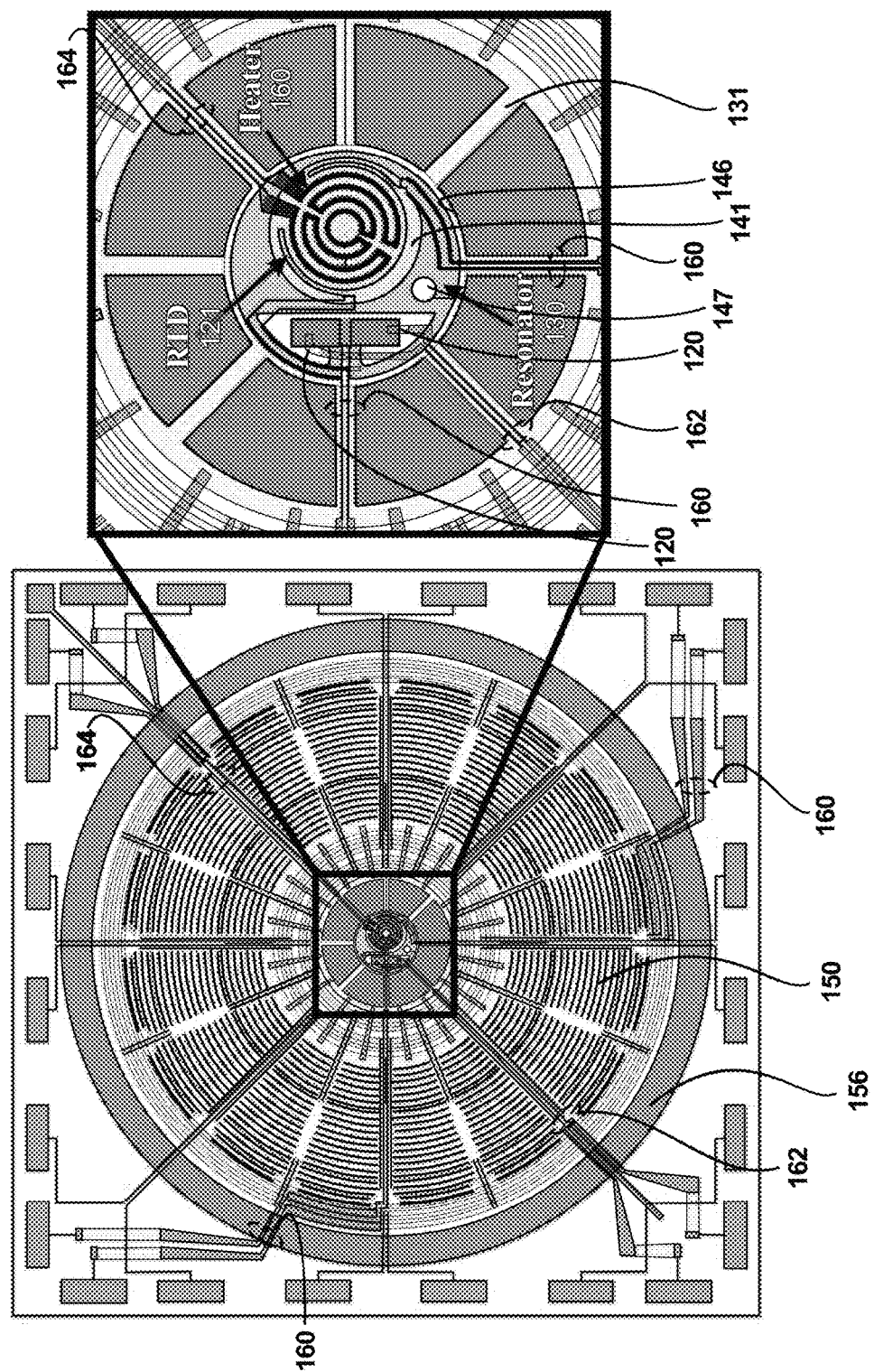
FIG. 4 is a plan view of the DRG resonator and the quartz resonator located with the heater and RTD, with the central portion of the DRG resonator shown in a blown up view to show the cavity 146 with the quartz resonator received therein and the underlying heater and RTD.

Modal and f/T analysis have been performed to confirm that with proper electrode shape and trial and error mesa optimization, good confinement of the fundamental shear mode and the predicted f/T characteristics can be obtained with this embodiment of a 1-mm-diameter resonator. The results are depicted in FIGS. 4 and 5 of U.S. Provisional Patent Application Ser. No. 61/906,356. The expected SC-cut f/T profile with a flat region between about 70°-130° C. is seen. The good modal confinement results in a high Q design with a f×Q product near 1×1013. In addition, low R1 values can be obtained with this small design as shown in FIG. 6 of U.S. Provisional Patent Application Ser. No. 61/906,356. R1 values below about 40Ω allow low-noise oscillating sustaining circuits to be easily constructed for use in low-phase-noise applications.

FIG. 3 depicts, in a schematic form, the various steps preferably used to make the resonator 130. Step 1 show the starting materials, which include the quartz 502 from which the resonator 130 will be formed, a silicon wafer 500 which will be used as a temporary handle wafer and the substrate 100 of the DRG resonator. Embedded in the substrate 100 (as is schematically depicted by FIG. 3 or alternatively disposed on substrate 100) may be the oscillator electronics 508, for example, to which the resonator is subsequently connected. The electronics 508 of FIG. 3 is not intended to depict any particular electronic circuit but merely to show that an electronic circuit in and/or on substrate 100 is coupled with the electrodes 141$t$ and 141$b$ of the resonator 130.

At step 2 a cavity in formed in the silicon handle wafer 500. Next at step 3 the upper surface of the quartz wafer is shaped as needed to define the mesa (see FIG. 2A, for example) and then the upper active region 141$t$ of the resonator is formed along with a plug 134 of metal (preferably gold) to which the upper active region 141$t$ of the resonator is connected by metal 137 (also preferably gold, see FIG. 2C). Then at step 4 the handle wafer 500 is temporarily bonded to the quartz wafer 502, with the cavity in the handle wafer providing a space for the previously formed metal resonator 141$t$ and plug 134 to occupy until the handle wafter is later removed.

At step 5 the quartz wafer is preferably thinned as appropriate, also defining mesa 139 on its bottom surface (see FIG. 2A, for example) if desired. Then at step 6 a via 147 is formed penetrating quartz wafer 502 to the backside of plug 134 and then the via 147 is filled with metal (preferably gold).

At step 7 the bottom portion 141$b$ of the active region 141 is formed along with contacts 132 and 133. Not shown in these schematic steps, but it is to be understood that contacts 132 and 133 are formed at the ends of the tethers 140 depicted in FIGS. 1D and 2A-2C. The contacts 132 and 133 are then preferably built up at step 8 to be thicker than portion 141$b$ of the resonator active area 141. At step 8 the quartz resonator is etch and patterned. The tethers 140 are etched in the quartz preferably at the same time as the active region 141 of the resonator 130 is etched.

Next at Step 10 the substrate 100 is cleaned as needed so that the resonator 103 can be bonded to it at Step 11 preferably by a compression bonding technique. Then the silicon handle wafer can be removed as shown as Step 12.

FIG. 4 is a plan view of the DRG resonator 150 and the quartz resonator 130 located with its associated heater 160 and RTD 121 within the cavity 146 formed in the central portion of the DRG resonator 150. The cavity 146 in the central portion is shown in a blown up view to better shown the resonator 130 received therein with the underlying heater 160 and RTD 121 which are preferably buried under a layer of dielectric 110 (see FIG. 1A). The heater 160 and RTD preferably have circularly shaped elements which are preferably disposed with the outer circumference of the active area 141 of the resonator 130.

The active area 141 of the resonator 130 is shown as being circular or nearly circular. However, a closer inspection of FIG. 2A reveals that the preferred dimensions of the active region 141 is 560 µm across by 580 µm high for an embodiment of the resonator 130 whose outside diameter is only 1 mm, which diameter includes not only the active region 141, but also the tethers 140 and their contacts 132 and 133. The active region 141 is preferably elliptically shaped as this helps suppress undesirable oscillations compared to a strictly circularly shaped active region 141.

Attachments A and B to U.S. Provisional Patent Application Ser. No. 61/906,356, filed Nov. 19, 2013, show additional details with respect to the resonator disclosed herein. Those attachments are incorporated herein by reference.

It is noted that the assembly disclosed above can be used advantageously to fabricate an integrated Inertial Navigation System (INS) having reduced size, weight and power consumption. Aircraft manufacturers have many needs for INSes allowing precision navigation for missiles and aircraft, particularly for Unmanned Aerial Vehicles (UAVs), where the navigation package needs to be small, lightweight, and of a low power design.

In addition, as autonomous vehicles become more prevalent on public roads, on-board GPS navigation system coupled to an INS will become more important for automobile companies. In the event of a loss in the GPS signal, local navigation from on-board systems will be important. Small, low cost precision navigation can prevent missed turns and guidance errors with meter accuracy for several minutes during GPS outages.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art.

No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . " The numbering of steps in a method or process claim is not, by itself, intended to require that the steps of the method or process claimed be necessarily carried out in the order of the numbering.

What is claimed is:

1. A resonator assembly comprising:
   a first substrate;
   a resonator gyroscope disposed on or adjacent said first substrate, the resonator gyroscope including a first resonator formed in a layer of a first material; and
   an oscillator disposed on or in the substrate, the oscillator being associated with and electrically coupled to a second resonator, the second resonator having electrodes disposed on opposing surfaces of a second substrate formed of a second material;
   the second resonator being supported from said substrate in a cantilevered fashion by springs or tethers formed of said second material, the springs or tethers having electrical conductors disposed thereon which ohmically couple the electrodes of the second resonator with the oscillator;
   wherein the first resonator comprises a central mounting stem, the central mounting stem having a cavity located therein, and wherein the second resonator is disposed within said cavity.

2. The resonator assembly of claim 1, further comprising a common heater centrally located beneath the first and second resonators.

3. The assembly of claim 1, wherein the first material is silicon and the second material is quartz.

4. The resonator assembly of claim 3, wherein the second resonator is a SC-cut shear-mode quartz resonator.

5. The resonator assembly of claim 3, wherein the quartz resonator has electrodes comprising gold.

6. The resonator assembly of claim 1, wherein the cavity includes vent ports.

7. The resonator assembly of claim 6, in which the two resonators are vacuum sealed in a common housing.

8. The resonator assembly of claim 7 in which heaters are placed on the outside surface of the common housing.

9. The resonator assembly of claim 1 wherein the first substrate is a semiconductor substrate.

10. The resonator assembly of claim 9 wherein springs or tethers are elongated, following a smooth curve from a point of joining with a main body portion of the second material to distill ends thereof, the distill ends having contacts coupled with or made from the electrical conductors disposed on said springs or tethers, said contacts providing a sole means of supporting the second resonator from said first substrate.

11. The resonator assembly of claim 9 wherein springs or tethers are elongated, conformally following a smooth curve with a main body portion of the second material to distill ends thereof.

12. The resonator assembly of claim 11 wherein said springs or tethers are defined by plasma etching said second material.

13. The resonator assembly of claim 1 wherein springs or tethers are formed of said second material integrally with the second material upon which said electrodes are disposed on opposing surfaces thereof.

14. The resonator assembly of claim 1 wherein said springs or tethers are defined by plasma etching said second material.

15. A resonator assembly, the resonator assembly comprising:
    a substrate;
    a gyroscope supported by said substrate;
    an oscillator resonator having electrodes disposed on opposing surfaces of a layer of material, the layer of material having a generally rounded shape, the oscillator resonator also having elongate springs or tethers, the elongate springs or tethers being formed from said layer of material, an exterior surface of each of the springs or tethers continuing to follow said rounded shape along a major portion of a length of each spring or tether, the elongate springs or tethers having conductors formed thereon, the conductors also being formed on the layer of material to make electrical contact with said electrodes disposed on opposing surfaces of the layer of material, said conductors also making electrical contact with contacts formed on distal ends of said elongate springs or tethers, and
    means for attaching the oscillator resonator to the substrate at the contacts formed on the distal ends of said elongate springs or tethers of the oscillator resonator.

16. The apparatus of claim 15, wherein the electrodes of the oscillator resonator are supported in a cantilevered fashion above said substrate by said layer of material including by said elongate springs or tethers formed from said layer of material.

17. The apparatus of claim 16 wherein said layer of material is a layer of quartz material and wherein the springs or tethers are integral with the quartz material upon which said electrodes are disposed on opposing surfaces thereof.

18. The apparatus of claim 15 wherein the springs or tethers are elongated, following a smooth curve from a point of joining with a main body portion of the quartz material to a distill ends thereof, the distill ends having said contacts coupled with or made from the electrical conductors disposed on said springs or tethers, said contacts providing a sole means of supporting the second resonator from said substrate.

19. An apparatus comprising:
    a quartz substrate having at least one via therein, the quartz substrate having a generally rounded shape with integral springs or tethers also defined in the quartz substrate, an exterior surface of each of the springs or tethers continuing to follow said rounded shape along a major portion of a length of each spring or tether;
    connection pads disposed at distal ends of the springs or tethers on a common side thereof;
    resonator electrodes disposed on two opposing sides of the quartz substrate;
    connection means connecting the connection pads on distal ends of the springs or tethers with said resonator electrodes on two opposing sides of a quartz substrate, the connection means including one connection from one of the connection pads on one distal end of the one of the springs or tethers to one of the resonator electrodes using said via to traverse from one major surface of the shaped quartz substrate to the opposing major surface thereof; and
    a second substrate having an associated oscillator, support for a DRG resonator, and pads for mating with the connection pads disposed on distal ends of said springs or tethers.

20. The apparatus of claim 19 wherein the springs or tethers in the quartz substrate define rounded shapes without sharp corners where said springs or tethers attach to a major portion of the quartz substrate to thereby provide stress relief at said rounded shapes where said springs or tethers attach to the major portion of the quartz substrate.

21. The apparatus of claim 19 wherein said major portion of the length of said springs or tethers define a radius of a circle.

22. The apparatus of claim 21 wherein all of said apparatus is disposed within said circle.

23. The apparatus of claim 22 wherein said resonator electrodes are formed on mesa regions defined on said two opposing sides of a quartz substrate.

24. The apparatus of claim 19 wherein said resonator electrodes are each formed with an elliptical shape when viewed in a plan view thereof.

25. The apparatus of claim 19 wherein the second substrate supports and is coupled with said DRG resonator.

26. The apparatus of claim 25 wherein said pads for mating with the connection pads disposed on distal ends of said springs or tethers are electrically coupled, in use, with said oscillator.

27. The apparatus of claim 19 wherein the gyroscope includes a gyroscope resonator formed in a layer of a material different than the material of said oscillator resonator.

28. A connection apparatus for making a reduced stress connection between an oscillator resonator of a first material and a resonator-supporting structure of a second material, the oscillator resonator having electrodes disposed on opposing surfaces of a substrate of the first material having a generally rounded shape, the connection apparatus comprising:
    elongate springs or tethers, the elongate springs or tethers being formed from said substrate of the first material, an exterior surface of each of the springs or tethers continuing to follow said rounded shape along a major portion of a length of each spring or tether, the elongate springs or tethers having conductors formed thereon, the conductors also being formed on the substrate of the first material to make ohmic contact with the electrodes disposed on opposing surfaces of the substrate of the first material, the conductors also making ohmic contact with contacts formed at or near distal ends of the elongate springs or tethers, and
    wherein the contacts formed at or near the distal ends of the elongate springs or tethers are sufficiently remote from the oscillator resonator to reduce stress in the oscillator resonator to an acceptable level, the stress being induced by temperature variations when the first and second layers of material have different coefficients of thermal expansion.

* * * * *